(12) United States Patent
Creamer et al.

(10) Patent No.: US 10,784,826 B2
(45) Date of Patent: Sep. 22, 2020

(54) BIAS SEQUENCING AND SWITCHING CIRCUIT

(71) Applicant: BAE Systems Information and Electronic Systems Integration Inc., Nashua, NH (US)

(72) Inventors: Carlton T. Creamer, Brookline, NH (US); Christopher R. Bye, Bedford, NH (US); Vali Touba, Bedford, NH (US); Stephen J Creane, Arlington, VA (US)

(73) Assignee: BAE Systems Information and Electronic Systems Integration Inc., Nashua, NJ (US)

( * ) Notice: Subject to any disclaimer, the term of this patent is extended or adjusted under 35 U.S.C. 154(b) by 69 days.

(21) Appl. No.: 16/169,092

(22) Filed: Oct. 24, 2018

(65) Prior Publication Data
US 2020/0136571 A1 Apr. 30, 2020

(51) Int. Cl.
| H03F 1/14 | (2006.01) |
| H03F 3/21 | (2006.01) |
| H03F 3/19 | (2006.01) |
| H03F 1/02 | (2006.01) |
| H03F 3/68 | (2006.01) |

(52) U.S. Cl.
CPC .......... *H03F 3/211* (2013.01); *H03F 1/0277* (2013.01); *H03F 3/19* (2013.01); *H03F 3/68* (2013.01); *H03F 2200/451* (2013.01); *H03F 2203/211* (2013.01)

(58) Field of Classification Search
CPC .......... H03F 3/211; H03F 1/0277; H03F 3/19; H03F 3/68; H03F 2203/211; H03F 2200/451; H03F 3/72; H03G 1/0088
USPC ............................................. 330/51; 327/124
See application file for complete search history.

(56) References Cited

U.S. PATENT DOCUMENTS

| 5,812,590 A * | 9/1998 | Black | H04B 1/69 |
| | | | 331/18 |
| 8,159,184 B2 * | 4/2012 | Emori | B60L 3/0046 |
| | | | 320/116 |
| 8,518,570 B2 * | 8/2013 | Kudo | H01M 10/425 |
| | | | 320/116 |
| 9,130,379 B2 * | 9/2015 | Sakabe | B60L 3/0046 |
| 2012/0133370 A1 * | 5/2012 | Kubo | G01R 31/396 |
| | | | 324/433 |

* cited by examiner

*Primary Examiner* — Khanh V Nguyen
(74) *Attorney, Agent, or Firm* — Sand, Sebolt & Wernow LPA; Scott J. Asmus

(57) ABSTRACT

The present disclosure provide a device, system, and method for generating, in an electrical device, a 1 bit or a 0 bit that is received in a switching circuit powered by a battery. The device, system, and method generates, in the switching circuit, a negative bias voltage and a positive bias voltage. The device, system, and method transmits the negative bias voltage and the positive bias voltage to a power amplifier. The device, system, and method turns the power amplifier from an off-state to an on-state in response to receiving the negative bias voltage. The device, system, and method amplifies, with the power amplifier, a power signal moving through power amplifier when the amplifier is in the on-state.

17 Claims, 4 Drawing Sheets

BIAS SEQUENCING AND SWITCHING CIRCUIT

STATEMENT OF GOVERNMENT INTEREST

This invention was made with government support under Contract No. 736930SC-BAE-01. The government has certain rights in the invention.

TECHNICAL FIELD

The present disclosure relates generally to a circuit including a power amplifier and a switching circuit or portion. More particularly, the present disclosure relates to a radio frequency (RF) power amplifier that is controlled by a switching circuit or portion that is configured in a manner to be powered at low voltages by a single cell battery.

BACKGROUND

Single cell batteries may sometimes be referred to as "monoblocks." In contrast to conventional batteries, such as AA or AAA batteries, single cell batteries are not composed of multiple cells, but just one cell. In some examples, the single cell may be about one, two, three, or four volts. In some instances and depending on the capacity of the battery, there may be one, two or four positive and negative connection points on the cover of the battery. Due to its compact housing and wide range of different capacities, it is possible to construct a sufficient battery system in a small space. Further, since a single cell battery can be placed in any direction without leaking, these battery-powered systems are very service-friendly.

An RF module (radio frequency module), which may also be referred to as an RF device, may be a small electronic device used to transmit and/or receive radio signals between two electrical devices. In an embedded system it is often desirable to communicate with another device wirelessly. This wireless communication may be accomplished through optical communication or through radio frequency (RF) communication. For many applications, the medium of choice is RF since it does not require line of sight. RF communications incorporate a transmitter and a receiver. Some portions of the RF device may include an amplifier to assist in the transmission and reception of a signal. More particularly, some amplifiers that assist the RF device may be a field-effect-transistor (FET) transmission amplifier.

An RF device may be powered by a battery. More particularly, the RF device may be powered by a single cell battery. However, when using an electrical device under battery power, efforts must be taken to ensure and maximize battery life so that the RF device can be utilized as long as possible.

SUMMARY

Issues continue to exist with battery powered FET-based transmission amplifiers as they need to be switched off when not in use to preserve battery life. These FET-based transmission amplifiers also require converters to generate dual polarity bias supplies from a single battery. Switching circuits that provide this type of functionality are generally large and typically operate at higher voltages, requiring multiple series batteries. On-resistance is typically high, lowering power amplifier efficiency. The present disclosure addresses these and other issues.

In accordance with one aspect of the present disclosure, an exemplary embodiment provides a low loss, single cell battery-powered, bias sequencing and switching circuit. The circuit of this exemplary embodiment is a low loss switching and inverter circuit that operates at single cell voltages (as low as +2.5V) with low on resistance (<90 milliohm). It may also include selectable 1 or 0 enable logic, providing flexibility to the user. This exemplary circuit may operate from only a single battery cell, lowering the size, weight, power, and cost (SWaP-C) of the overall power amplifier. It may also maintain a high level of performance as battery voltage decays from beginning of life (BOL)+3.6-4.2V to end of life (+2.5V).

In one aspect, an exemplary embodiment of the present disclosure may provide a method comprising: generating, in an electrical device, a 1 bit or a 0 bit; receiving, in a switching circuit powered by a battery, the 1 bit or the 0 bit; generating, in the switching circuit, a negative bias voltage and a positive bias voltage; transmitting the negative bias voltage and the positive bias voltage to a power amplifier; turning the power amplifier from an off-state to an on-state in response to receiving the negative bias voltage; and amplifying, with the power amplifier, a power signal moving through power amplifier when the amplifier is in the on-state. This exemplary embodiment or another exemplary embodiment may further provide that the battery that is a single cell battery; outputting, from the single cell battery, a voltage that is less than about 3.6 volts; and transmitting the voltage through an input in the switching circuit. This exemplary embodiment or another exemplary embodiment may further provide transmitting the negative bias voltage before transmitting the positive bias voltage to the power amplifier. This exemplary embodiment or another exemplary embodiment may further provide generating, with the enable circuit, a control bias voltage; and transmitting the control bias voltage to a pin or port in a controller having an inverter. This exemplary embodiment or another exemplary embodiment may further provide transmitting, from a controller in the switching circuit, the positive bias voltage to a switching device in the switching circuit; and transmitting, the positive voltage bias from the switching device to the power amplifier. This exemplary embodiment or another exemplary embodiment may further provide creating, with a charge pump, a negative voltage bias at a regular frequency depending on an amount of current in the circuit. This exemplary embodiment or another exemplary embodiment may further provide generating the 1 bit or the 0 bit with device powered by a battery; receiving the 1 bit or the 0 bit in an enabling circuit; transmitting the 1 bit or the 0 bit through a trigger in the enabling circuit; and transmitting the 1 bit or the 0 bit through an Exclusive OR gate logic in the enabling circuit. This exemplary embodiment or another exemplary embodiment may further provide generating, with the enabling circuitry, a shutdown signal based on the 1 bit or the 0 bit; receiving, at a pin in a controller having an inverter, the shutdown signal along transmission line from the enabling circuit. This exemplary embodiment or another exemplary embodiment may further provide receiving the power signal in the power amplifier from the electrical device, wherein the electrical device is a radio frequency (RF) device and the power signal is an RF power signal.

In another aspect, an exemplary embodiment of the present disclosure may provide an assembly comprising: an electrical device configured to generate a 1 bit or a 0 bit; a battery powering the electrical device; a bias sequencing and switching circuit coupled with battery that generates bias voltages; and a power amplifier connected to the bias sequencing and switching circuit that is switched between an on-state and an off-state in response to the bias voltages. This exemplary embodiment or another exemplary embodiment may further provide an enable circuit in the bias sequencing and switching circuit that receives the 1 bit or the 0 bit; a controller circuit in the bias sequencing and switching circuit, and the controller circuit having an inverter; and a port or pin on the controller circuit coupled to a portion of the enable circuit. This exemplary embodiment or another exemplary embodiment may further provide a switching device in the bias sequencing and switching circuit coupled to a different port or pin on the controller circuit and coupled with the power amplifier; and wherein the enable circuit is operative to transmit an enabling signal to be sent to the inverter that is timed to produce a negative bias voltage as the first output of the controller. This exemplary embodiment or another exemplary embodiment may further provide a positive bias generated by the bias sequencing and switching circuit; and a negative bias generated by the bias sequencing and switching circuit; wherein an initiation sequence of the bias sequencing and switching circuit is operative to send the negative bias from the bias sequencing and switching circuit to the power amplifier and subsequently send the positive bias from the bias sequencing and switching circuit to the power amplifier. This exemplary embodiment or another exemplary embodiment may further provide at least two parallel resistors along a transmission line carrying the positive bias from the bias sequencing and switching circuit to the RF power amplifier; and at least one resistor along a transmission line carrying the negative bias from the bias sequencing and switching circuit to the RF power amplifier. This exemplary embodiment or another exemplary embodiment may further provide a single cell in the battery that produces a voltage of about 3.6 volts or less.

In yet another aspect, an exemplary embodiment may provide a switching circuit comprising: a controller including an inverter and a plurality of nodes; a switching device connected to the controller via a transmission line extending from a node on the switching device to a node on the controller; a transmission line connected to an output node of the switching device that is operative to transmit positive bias voltage to a power amplifier; a transmission line connected to an output node of controller that is operative to transmit negative bias voltage to a power amplifier; and a voltage input coupled with a transmission line connected to the controller. This exemplary embodiment or another exemplary embodiment may further provide an enabling circuit having a first input and a second input, and the first input is operative to receive a 0 bit and the second input is operative to receive a 1 bit, wherein a transmission line connects the enabling circuit to a different node in the controller. This exemplary embodiment or another exemplary embodiment may further provide a bank of capacitors connected between the voltage input and the switch device adapted to condition power flowing through the voltage input as a filter.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
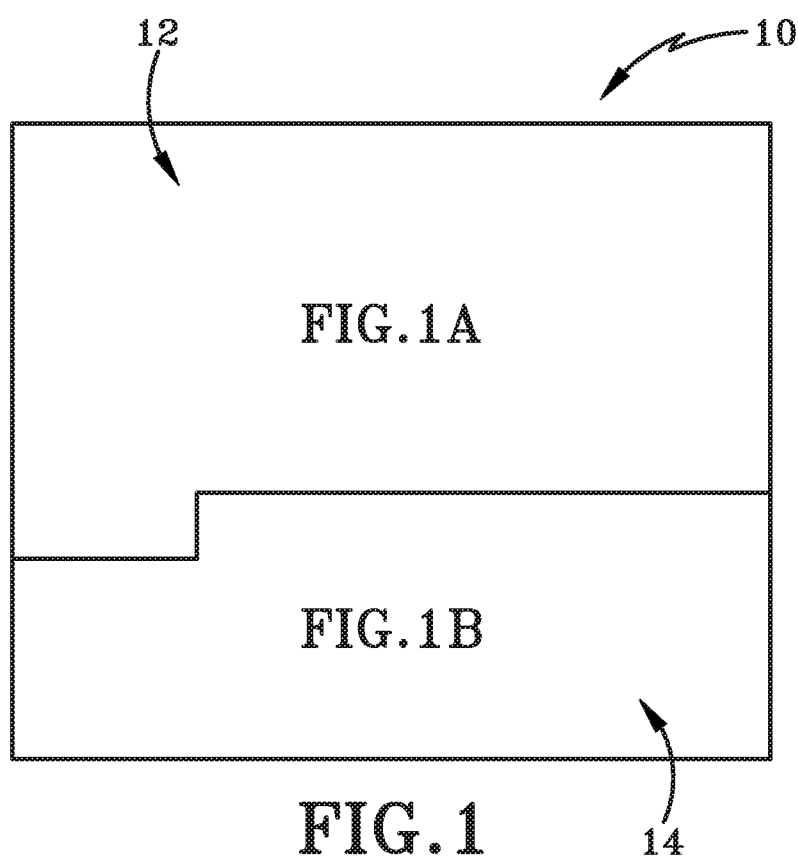
FIG. 1 (FIG. 1) is a diagrammatic view of a circuit in accordance with the present disclosure which schematically shows one portion of the circuit being positioned above another portion of the circuit; however, it is to be understood that the diagrammatic references are to be viewed together.

FIG. 1 diagrammatically depicts a low loss, battery-powered, bias sequencing and switching circuit coupled with an RF power amplifier generally at 10. The circuit 10 includes the switching circuit 12, which may be generally referred to as the switching portion, and an RF amplifier 14, which may be generally referred to as the RF amplifier portion 14. As will be described in greater detail below, the switching circuit 12 is coupled with the RF amplifier 14 and is configured to send bias voltages from the switching circuit 12 to the RF amplifier 14 to control the same and switch the RF amplifier 14 between an on-state and off-state. The switching circuit 12 configuration enables the RF amplifier 14 to achieve low loss and be battery powered, such as by a single cell battery, which enables the circuit 10 to operate at low voltages. In one embodiment, the low voltages of the single cell battery may be less than about 3.6 volts.

Figure 1A:
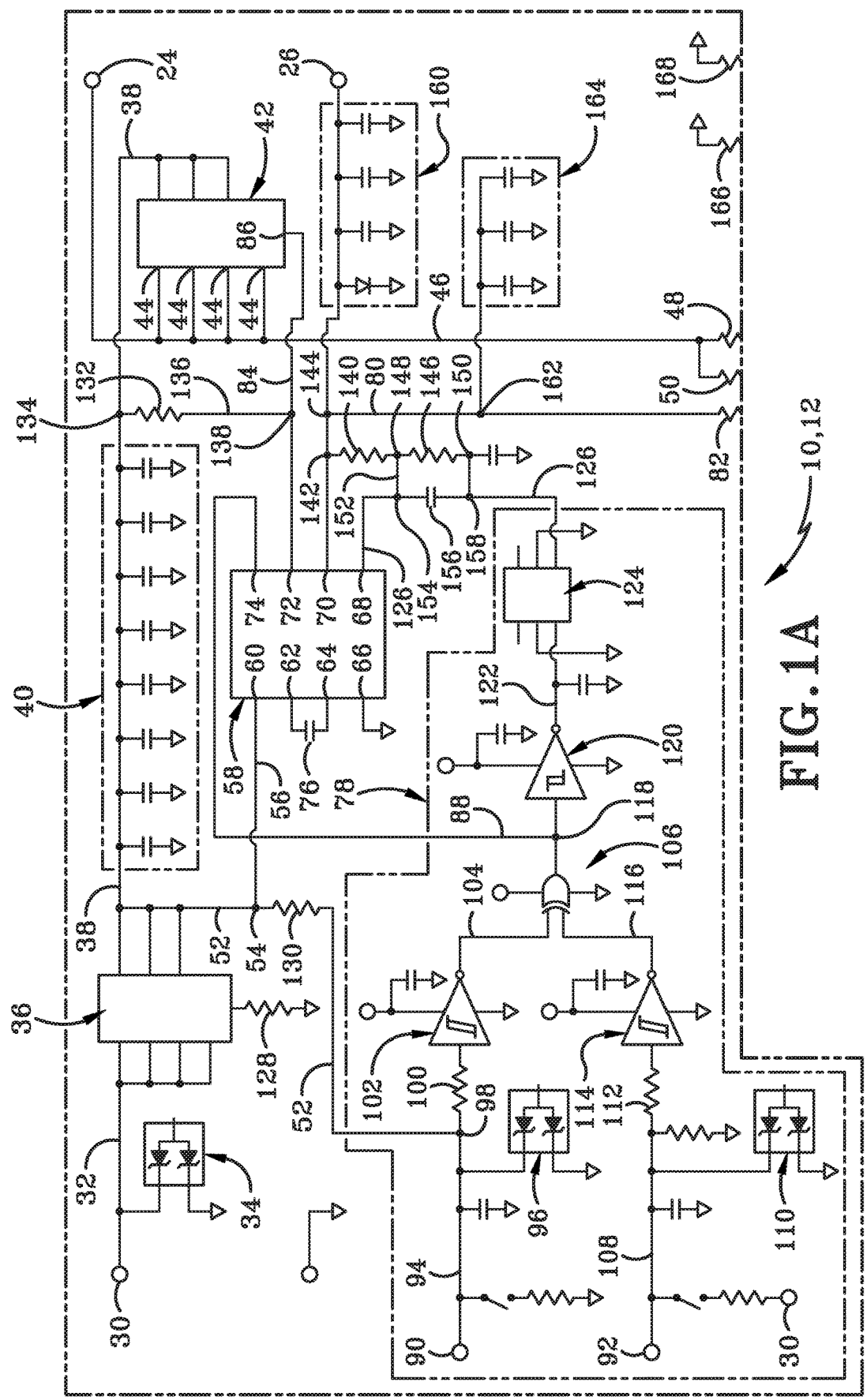
FIG. 1A (FIG. 1A) is an enlarged schematic of a switch circuit positioned in the region labeled "FIG. 1A" in FIG. 1.
Figure 1B:
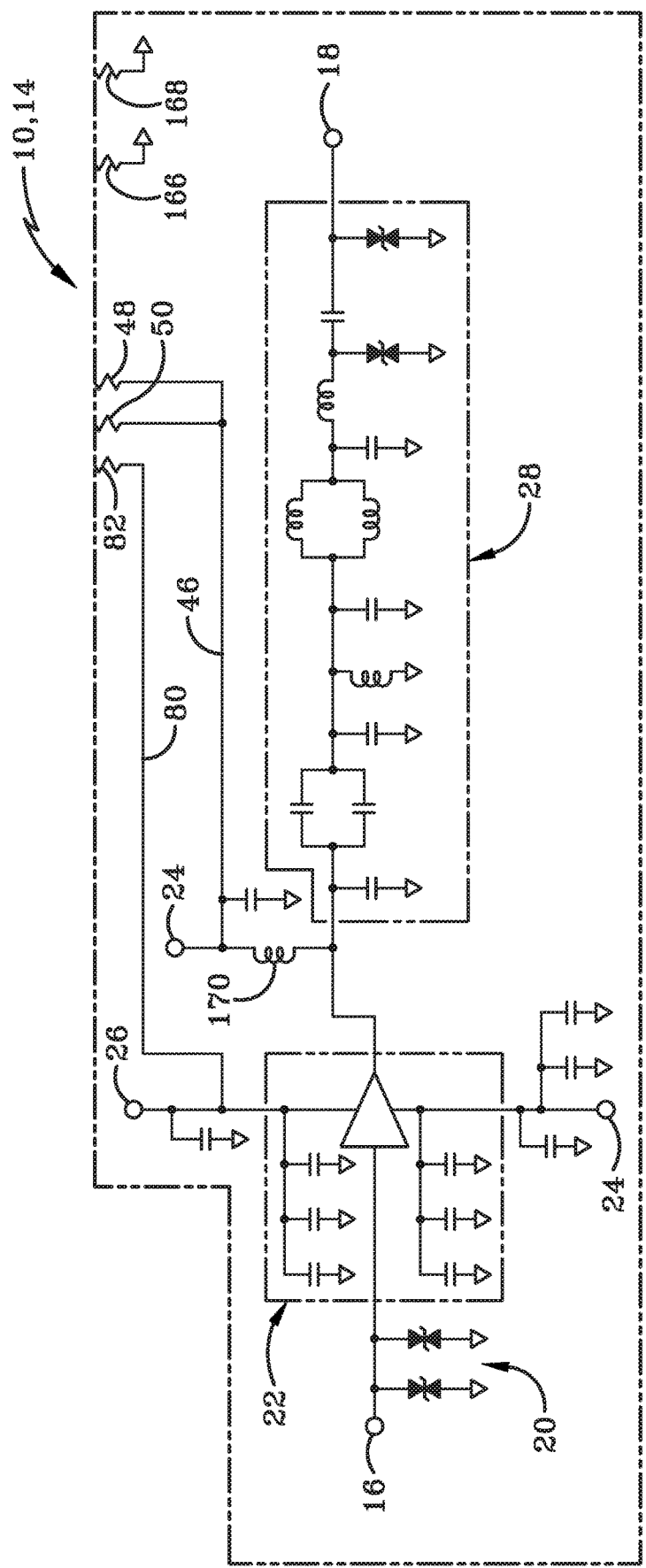
FIG. 1B (FIG. 1B) is a schematic view of an RF amplifier circuit located in the region labeled "FIG. 1B" in FIG. 1.

FIG. 1 depicts the circuit 10 diagrammatically and FIG. 1A and FIG. 1B are shown as being connected. The schematics of FIG. 1A and FIG. 1B are to be understood and should be read together. Accordingly, reference to the circuit 10 may be made with reference to both FIG. 1A and FIG. 1B. When viewing this disclosure, a reader will understand to review FIG. 1A and FIG. 1B at the same time as many of the components and electrical connections span both figures and require viewing both figures to understand how voltages and current flow through each portion of the circuit 10.

The RF power amplifier 14 includes an input 16 and an output 18. Electrical signals flow from the input 16 to the output 18 to establish a flow of electrons that are amplified therebetween. Accordingly, some components of the RF amplifier 14 may be made with reference as being positioned upstream or downstream from other components relative to the flow of electrons from the input 16 to the output 18. An electrostatic discharge (ESD) device 20 is positioned downstream from the RF input 16. A quad-flat no-leads (QFN) package 22 is electrically connected downstream from the ESD device 20. The QFN package 22 is electrically connected with a bias control voltage Vdd 24 and a bias control voltage Vg 26. An output impedance network 28 is coupled downstream with the QFN package 22. The output impedance network 28 may include, capacitors, inductors, and other electrical devices to match or drive the impedance output from the QFN package 22. The output impedance network 28 is downstream from the QFN package 22 and is configured to control the output impedance therefrom. The output impedance network 28 is positioned upstream from the RF output 18. As will be described in greater detail below, the switching circuit 12 or switching portion is electrically coupled with the RF amplifier 14 in order to switch and control the same between an on-state and an off-state.

The switching circuit 12 includes a power input 30. A transmission line 32 extends downstream from the input 30 and is connected with an ESD device 34. Transmission line 32 is split fed into a reverse protection circuit that is a low loss pass transistor 36, wired as a reverse protection diode. A transmission line 38 is output downstream from the pass transistor 36 and extends along a bank of filter capacitors 40. In one particular embodiment, there are eight filter capacitors 40 within the bank. However, other numbers of capacitors are entirely possible. Further, the values associated with each capacitor may vary. Furthermore, alternatively, the value of each capacitor may be the same. In one particular embodiment, the value of the filter capacitors 40 may in a range from about 0.1 µF to about 33 µF. Transmission line 38 extends beyond the bank of filter capacitors 40, which are for power storage, and connects with a switch transistor 42 which acts as the main switch of switching circuit 12. In one particular embodiment, the switch transistor 42 includes eight pins. Four output pins 44 are connected with transmission line 46 that is coupled with the control bias Vdd 24. Transmission line 46 bridges the connection of the RF amplifier 14 and the switch 12 across two zero ohm (shorts) resistors 48,50. Namely, a first resistor 48 and a second resistor 50 span and bridge the connection of the switch 12 to the RF amplifier 14. Transmission line 46 continues in the RF amplifier 14 to an inductor connecting the output impedance network 28.

Referring back to FIG. 1A, the reverse protection circuit 36 includes another output transmission line 52 that is downstream coupled at node 54 with transmission line 56 that is input into a controller 58. In one particular embodiment, the controller 58 includes eight pins, namely, a first pin 60, a second pin 62, a third pin 64, a fourth pin 66, a fifth pin 68, a sixth pin 70, a seventh pin 72, and an eighth pin 74. With continued reference to FIG. 1A and more particularly the controller 58, the second pin 62 and the third pin 64 may be coupled together with a capacitor 76 that may be in a range from about 0.01 µF to about 1 µF. The fourth pin 66 may be connected to ground. The fifth pin 68 is connected to an enabling circuit 78, which will be described in greater detail below. The enabling circuit 78 provides a control voltage reference onto the fifth pin 68. The sixth pin 70 is an output for a negative gate bias that is output from the controller 58. The negative gate bias output is fed along transmission line 80 to a resistor 82 that bridges the switch circuits 12 to the RF amplifier 14. Transmission line 80 continues downstream past the resistor 82 to connect with the bias voltage Vg 26 as input into the QFN package 22. The seventh pin 72 provides a shutdown voltage along transmission line 84 to connect with the main switch 42 at an input pin 86. The eighth pin 74 receives a shutdown signal along transmission line 88 from the enabling circuit 78.

The enabling circuit 78 includes a first input 90, which may be referred to as "Enable 0," and a second input 92, which may also be referred to as "Enable 1." Each input may receive voltages or signals that can be used to control the controller 58 in order to operate the main switch 42 to send the bias voltages into the RF amplifier 14 in order to control the same. The first input 90 is connected with a transmission line 94 that is coupled with an ESD device 96 and receives transmission line 52 at node 98. A resistor 100 is downstream from node 98 and is upstream from a Schmitt trigger 102. The output of the Schmitt trigger 102 travels along transmission line 104 to an exclusive OR gate logic 106. Similar to the first input 90, the second input 92 sends signals along a transmission line 108 and may include an ESD device 110 that passes through a resistor 112 into a second Schmitt trigger 114. The output of the second Schmitt trigger 114 travels along transmission line 116 to the exclusive OR gate logic 106. The output of the exclusive OR gate logic 106 is coupled with transmission line 88 which sends the signal or current to the eighth pin 74 along transmission line 88 as a shutdown signal. Transmission line 88 couples with the output of the exclusive OR gate logic 106 at node 118. A Schmitt inverter 120 may receive the output of the exclusive OR gate logic 106 through the node 118. The Schmitt inverter 120 may output signals along transmission line 122 into a voltage reference 124 that has an output that extends along transmission line 126 coupled with the fifth pin 68 of the controller 58.

Having thus described some of the components of the switch circuit 12, some additional components are now described. For example, with reference to the pass transistor 36, a resistor 128 may be utilized to couple the same to ground to provide bias. Further, a resistor 130 is positioned along transmission line 52 between node 54 and node 98 to act as a pull up.

Similarly, resistor 132 acts as a pull up between node 134 along transmission line 38 to join via transmission line 136 to node 138 coupled to transmission line 84 that connects to switch transistor 86. In one particular embodiment, resistor 128 may equal 10 kΩ. Resistor 130 may equal 20 kΩ. Resistor 132 may equal 91 kΩ. Other resistors and other electrical devices may further be part of the switching circuit. For example, resistor 140 and 146 are connected at node 148 and connected via transmission line 152 and transmission line 126 to pin 68 at controller 58 to set adjust voltage which sets the output voltage at pin 70 of the controller 58 along which some of the negative gate bias flow out of the controller 58. A capacitor 156 may be about 150 µF and is positioned between node 154 and node 158 coupled to the transmission line 126. Node 144 may further be coupled with a supply conditioning 160 that are coupled with the bias voltage Vg 26. Further, transmission line 80 may be connected at node 162 with additional filtering capacitors 164 having a value of about 3.3 µF each.

The RF amplifier 14 and the switch circuit 12 may further be bridged together by zero ohm resistors (shorts). More particularly, a first Zero Ohm Resistor 166 and a second Zero Ohm resistor 168 may span and connect the ground circuits of switch circuit 12 and the RF amplifier 14 together.

Figure 2:
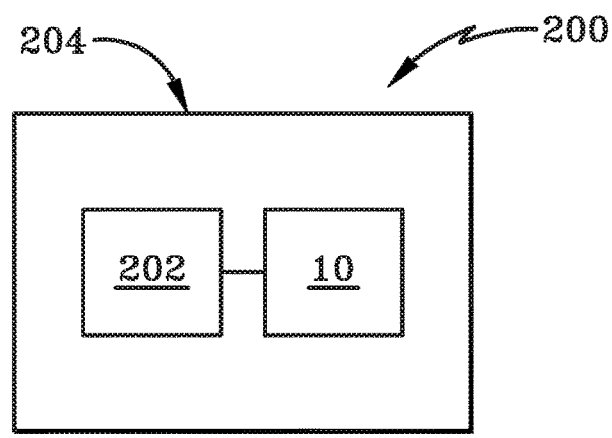
FIG. 2 (FIG. 2) is a schematic view of the switching circuit of FIG. 1 coupled with an RF device or module and a battery.

FIG. 2 depicts an assembly 200 in which circuit 10 is coupled to a battery 202 that powers an electrical device 204 to define the assembly 200. In one particular embodiment, the battery 202 is a single cell battery that produces about 3.6 volts or less. The single cell battery may be a rechargeable single-cell battery capable of being depleted by the electrical device 204 and replenished in response to being connected to a power source. Although a single cell battery is envisioned, the battery 202 in accordance with the present disclosure used to power the circuit may be any type of battery such as a multi-cell battery. Furthermore, the battery may include lithium ion or other power generating materials configured to impart a voltage when a circuit is connected between the negative terminal and the positive terminal of the battery. In one particular embodiment, the electrical device is an RF device or module. The RF device may be in the assembly 200 which enables the assembly 200 to transmit or receive signals.

Having thus described an exemplary non-limiting configuration of the circuit 10, its operation will be discussed with reference to some exemplary features. The circuit 10 and its amplifier 14 has high efficiency and low loss. Stated otherwise, the amplifier converts DC power to RF power very efficiently with very little going to waste heat compared to other circuits.

In accordance with one aspect of the present disclosure, the power amplifier 14 of the circuit 10 provided herein may be used in a radio transmitter, or other electrical device 204, that consumes power. Generally, the circuit 10 of the present disclosure is a portable amplifier configured to be powered by a single cell battery 202 that can be switched on and off by the switching circuit 12. Stated otherwise, the power amplifier 14 is turned on during the periods when the radio frequency generator (i.e., electrical device 204) needs to transmit and the power amplifier is turned off when power amplification is not needed. While other power amplifiers exist, the exemplary circuit 10 of the present disclosure enables the power amplifier 14 of the present disclosure to operate at low voltages, such as being powered by a single cell battery 202 as an assembly 200. Typically, the single cell battery is about 3.6 volts or less. Furthermore, the circuit 10 of the present disclosure requires a secondary control bias that is generated by switching circuit 12 from a single cell battery. Stated otherwise, the power amplifier 14 of the circuit 10 of the present disclosure needs about 3.3 volts to operate, but it also needs a secondary voltage which is generated by switching circuit 12 (i.e., the additional 0.3 volts output by the single cell battery). Thus, in one particular embodiment, the circuit 10 of the present disclosure takes power or voltage from the battery 202 and that power is switched to the drain side of a transistor and it also takes a portion of the battery power and converts it to a negative bias, which is the control bias that controls current in the power amplifier 14. The circuit 10 manages the power from battery 202 in an efficient manner to operate as a power amplifier at low voltages. An exemplary circuit 10 of the present disclosure may further provide that the voltages (Vdd 24 and Vg 26) going to the power amplifier 14 need to be applied in a specific order, both on powering on and powering off. The circuit 10 of the present disclosure handles and manages the sequencing of the voltages during powering on and powering off. In one particular embodiment, the control bias voltages are generated through an inverter function from a low starting voltage.

In accordance with one operational embodiment, it may be desirable to turn the circuit 10 on and off because if the circuit 10 was left on all of the time, then the useful lifetime of the battery 202 is reduced. Furthermore, the circuit of the present disclosure is turned on when the RF device that the circuit 10 is connected to needs to be in its transmit mode or receive mode. In order to power the device on, the RF device 204 that is coupled to the circuit 10 of the present disclosure may have an enable function that issues a discreet TTL compatible "1" or "0." The discreet "1" or "0" is what turns the circuit 10 on or off in response to an element being actuated, either directly or indirectly, on the RF device 204 coupled with the circuit 10 of the present disclosure.

With respect to the RF amplifier 14, it may include a ceramic QFN package 22 coupled with an output impedance matching network. The first component, which is the amplifier component, may have an input and an output. Each respective input and output may have ESD clamps coupled therewith so as to prevent electrostatic discharge through the circuit.

In one embodiment, the switching circuit 12 of the circuit 10 of the present disclosure is a low loss single cell switch circuit to switch the power amplifier component on and off. Stated otherwise, the switching component may be a circuit that is used to switch the circuit 10 on and off. The switching circuit 12 switches the bias voltages Vdd 24 and Vg 26. The bias voltages Vdd 24 and Vg 26 are coupled from the switching circuit 12 to the RF amplifier 14. The bias voltages are switched in order to turn the circuit 10 on and off.

Regarding the switching circuit 12, many components are coupled together to perform the function of switching the bias voltages Vg 26 and Vdd 24 so as to enable the circuit 10 to operate in a low loss and low voltage manner from a single cell battery source. The battery is connected to the input 30 (which may also be referred to as Vs). Typically, the voltage of the single cell battery is about 3.6 or 3.3 volts. However, lower voltages may be utilized. In other scenarios, the switching circuit of the present disclosure operates and functions with low loss in a range from about 2.5 volts to about 4.2 volts. Thus, as the battery decays below its typical voltage of about 3.6 volts, then the circuit exhibits graceful degradation. Stated otherwise, the voltage does not produce a sharp drop-off. Thus, when the battery reduces down to about 2.5 volts, the switching circuit will still fully function and the power amplifier will still function.

In operation and with reference to the circuit 10, voltage moves through the input 30 and is then directed via wires or transmission lines 32 to an ESD clamp 34 and to the pass transistor 36 via transmission lines. The pass transistor 36 is wired with reverse protection diodes to prevent the circuit from malfunctioning in the event the battery 202 is wired backwards.

Moving from the pass transistor 36, the voltage signals are connected to the bank of filter capacitors 40 that range from about 33 μF to about 0.1 μF and act as a filter for power conditioning. From these capacitors 40, voltages then travel to the switching device 42. The switching device 42 may be a transistor.

The switch transistor or the switching device 42 is switched or controlled by the controller 58, which may be a LTC126 device according to one exemplary embodiment. The voltage exiting from one pin, such as the seventh pin 72, from the LTC126 device (i.e., controller 58) is what turns the switch 42 on and off. When the switching device 42 is on, then the bias signal is routed through the switching device 42 and down the board/substrate along line 46 across the dotted line to the Vdd 24 connection on the power RF amplifier 14. This is what controls the positive bias for the power RF amplifier 14. When the circuit 10 is turned on, it is about 3.6 volts minus any losses in the switching circuit 12, which are minimal. In accordance of one aspect of the present disclosure, the term "low loss" refers to 100 millivolts or less. Thus, there may be about 3.5 volts at the power RF amplifier 14 device.

Reference will now be made to how the bias voltage Vg 26 is switched. Looking towards the reverse protection circuit or pass transistor 36, the output voltage may branch off and flow along a transmission line 52 towards the controller 58 (e.g., the LTC126 device). The controller 58 may include an inverter that operates as a voltage inverter to control the switching device 42 of the switching circuit 12.

Battery power from battery 202 is applied to the controller 58 which is an inverter and sequencing element. Voltage from the battery is applied at node one (i.e., first node 60 or first pin) of the inverter of the controller 58. At the fifth node 68 or gate 5, the enable circuit 78 provides a stable reference voltage to controller 58. Thus, with the reference voltage and the bias voltage, the eighth node 74 enables a shutdown control to output a one ("1") or a zero ("0") and that is what switches the power RF amplifier 14 through the switching device 12 on and off. The sixth pin 70 is the regulated output negative bias voltage and the seventh pin 72 provides the shutdown voltage to the gate of the main switch transistor 42 which controls the bias to the power RF amplifier 14. Stated otherwise, the reference voltage is only on when the controller 58 is on. When a shut down signal is present at 74, the voltage reference is also turned off (Pin 68). More particularly, the transistor of switching device 42 controls the positive bias to the power RF amplifier 14. The sixth pin 70 at controller 58, connects the internal charge of controller 58 to supply conditioning 160. The internal charge pump of controller 58 controls a switch to a capacitor to charge the capacitor in order to create a negative bias at a regular frequency depending on the amount of current moving through the circuit. In one particular embodiment, this provides a negative bias of about 1.23 volts (negative) that is applied to the gate of the RF power amplifier 14. Thus, looking towards sixth pin 70, an electrical line 80 comes out of sixth pin 70 and is output and connects with the Vg 26, which is the gate bias. More particularly, the negative bias out of the voltage inverter or controller 58 is the negative gate bias Vg 26 of the power RF amplifier 14.

In accordance with one aspect of the present disclosure, when initiating the circuit 10, certain components in certain embodiments occur in a preferred sequential order. In one particular embodiment, battery power from battery 202 connects at input 30 to the circuit 10 which may be wired to send a voltage to the switched enable circuit 78. Alternatively, enable signals can be provided from an external source. The enable circuit 78 routes the provides the enable signal to the controller 58 which is timed such that the first output that comes out of the inverter circuit is the negative bias. The negative bias from sixth pin 70 makes its way along line 80 to the power RF amplifier 14 before the output coming out of seventh pin 72 turns on the switching device 42 and applies the positive bias Vdd 24. When the shutdown signal is removed, the circuit 10 of the present disclosure works in an opposite manner. Namely, the signals shut off the transistor of switching device 42 first before the negative bias from sixth pin 70 tails away. This is one non-limiting example of how the switching circuit of the present disclosure manages the switching sequence for the power amplifier.

The enable circuit 78 is connected with pin 74 of the controller 58. The enabling circuit 78 operates and is connected in the following manner. The switching circuit 12 includes two separate enable inputs that may be used to enable the switch circuit. In the case it is desirable to enable the power amplifier with a logic state 1, 90 shall be fixed at a logic state 1 and 92 shall be switched between logic state 1 and 0. In the case it is desirable to enable the power amplifier circuit 14 with a Logic 0, 92 shall be fixed at a logic 0 and 90 shall be switched between logic 1 and 0. The logic truth table is as follows:

| Enable by Logic 0 | | | Enable by Logic 1 | | |
|---|---|---|---|---|---|
| Logic State Pin 90 | Logic State Pin 92 | Power Amplifier 14 | Logic State Pin 90 | Logic State Pin 92 | Power Amplifier 14 |
| 0 | 0 | on | 1 | 1 | on |
| 1 | 0 | off | 1 | 0 | off |

In one particular embodiment, the enable circuit 78 is considered as the group of devices that include the inputs 90, 92 connected to ESD clamps 96, 110. Then, the enabling circuit 78 further includes electrical devices 102, 114 and are combined into device 106. Then the enabling circuit 78 further includes the devices 102, 114 which may be inverting Schmitt triggers. These devices provide the current gain and invert the signal moving therethrough. Device 106 is an Exclusive OR gate logic which generates a Logic 1 when either of its inputs are a logic 1, but not both. The output of exclusive OR 106 is connected to eighth pin 74 to trigger shutdown. Additionally, the signal may also travel to the inverting Schmitt trigger 120. This is utilized to shut down the reference bias as a power saving mechanism. However, it is entirely possible that the power-saving aspect of this portion of the circuit could be eliminated if so desired. The voltage at 124 is a reference voltage, but the Schmitt trigger can shut this down.

The inputs for enable 0 and enable 1 allow this circuit to be enabled with either a "0" bit or a "1" bit. The enable circuit may be connected to external digital logic (not shown) in device 204 that decides how the external digital logic in device 204 is connected to the enable circuit. The external digital logic in device 204 will choose whether to send a logic 1 or a logic 0 to the respective enable 0 or enable 1. Alternatively, logic states may be generated within switch circuit 12 by use of control switches.

The external device logic in device 204 may code logic 0 and logic 1 sent to the enabling circuit in any manner as one having ordinary skill in the art would understand. For example, in some applications, a logic 0 bit may be sent to the enable 0 input which could refer to turning the enabling circuit 78 on. However, the circuit 10 may work equally well with the external device in device 204 sending a logic 1 bit to the enable 1 input to turn the circuit on. Essentially, the circuit 10 of the present disclosure enables an operator utilizing the same to code the external logical device to take advantage of the low loss power amplifier 10 in any manner useful thereto. In accordance with one non-limiting example, if the circuit 10 is to be enabled with a logic 1 bit, then a 1 becomes the on state and the 0 becomes an off state. Conversely, if the external logic device wants to enable the circuit with a 0, then the 0 becomes the on state and the 1 becomes the off state.

In accordance with one aspect of the present disclosure, one exemplary manner in rationale for the switch of the present disclosure operating so efficiently in low loss and low voltage scenarios is the arrangement and construction of the individual devices and components forming the switching circuit. For example, some of the devices and components may be commercial off the shelf devices that are heretofore known. However, in one particular embodiment, the efficiency of the circuit being operable to operate with low loss and low voltage scenarios as a switching power amplifier is generated from the manner in which each component is arranged relative to the others.

Further, certain aspects of the present disclosure could be reconfigured as integrated circuits to accomplish similar operations. For example, the enabling circuit could be redesigned as an integrated circuit to accomplish similar functions connected with a pin of the inverter circuit.

In accordance with one aspect of the present disclosure, the power amplified in 10 may be operated from a single cell battery that has low loss and has graceful degradation. Stated otherwise, the amplifier 10 operates down to as low as 2.5 volts and still works correctly. In one particular embodiment, there may be one or more 0 ohm resistors that bridge the line between the switch circuit 12 and the RF power amplifier 14 circuit. The 0 ohm resistors that bridge the circuits may enable the power amplifier 14 and switch circuit 12 functions to be physically separated, allowing a user to select only one particular function. Stated otherwise, if it is desirable to only use the switch aspect or only use the power amplifier aspect, then the device may be separated along the 0 ohm resistors 48, 50, 82, 166, and 168. Currently, the collective amplifier has three resistors along the electrical network wherein two resistors 48, 50 are along the positive bias and one resistor 82 is along the negative bias. Then there are two other 0 ohm resistors that bridge the ground.

The Vdd 24 and the Vg 26 shown in the upper portion of the switching circuit 12 reflect voltage outputs. The reason in which the figure is shown with the Vdd 24 output and the Vg 26 output split from the lower portion of the power RF amplifier 14 is because the pins 44 on switching device 42, which are the output of the switch, connect with the power RF amplifier 14 ahead of an inductor 170 and Pin 70 of the inverter output connects with Vg 26 of the power amplifier 14

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Figure 3:
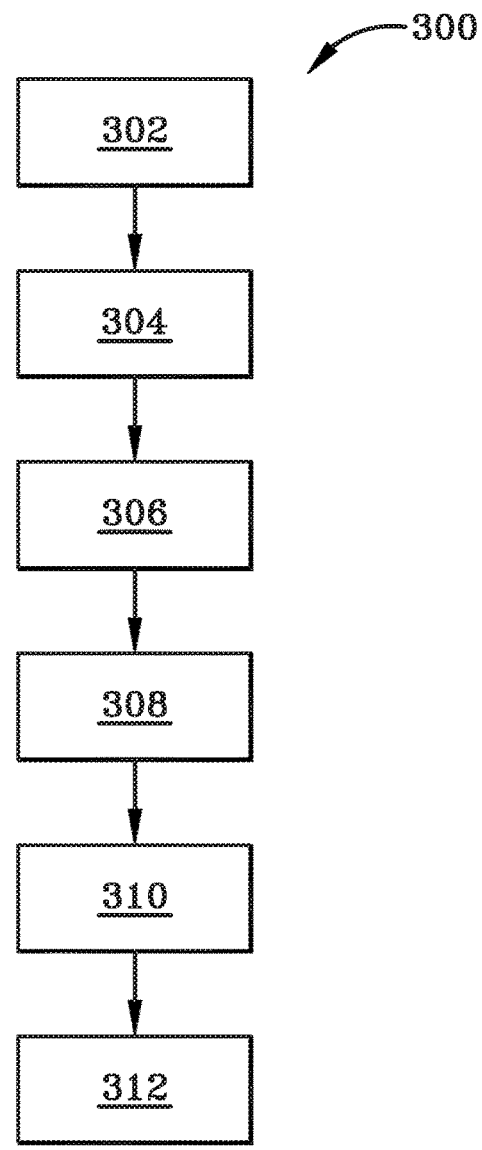
FIG. 3 (FIG. 3) is a flow chart in accordance with an exemplary method of operation of the present disclosure.

For example, FIG. 3 depicts an exemplary method in accordance with one aspect of the present disclosure generally at 300. Method 300 may include generating, in the electrical device 204, a 1 bit or a 0 bit, which is shown generally at 302. Method 300 may include receiving, in the switching circuit 12 powered by the battery 202, the 1 bit or the 0 bit, which is shown generally at 304. Method 300 may include generating, in the switching circuit 12, a negative bias voltage and a positive bias voltage, which is shown generally at 306. Method 300 may include transmitting the negative bias voltage and the positive bias voltage to the power amplifier 14, which is shown generally at 308. Method 300 may include turning the power amplifier 14 from an off-state to an on-state in response to receiving the negative bias voltage, which is shown generally at 310. Method 300 may include amplifying, with the power amplifier 14, a power signal moving through power amplifier when the amplifier 14 is in the on-state, which is shown generally at 312.

Step 302 may include or may be accomplished by a device such as an RF transmitter that is part of a greater electrical communication system. In some implementation, the electrical device 204 may be part of a radar system, a communication system, a laser system, or countermeasure system, or any other type of system using electrical or optical communications. The assembly 200 formed of the battery 202 and the circuit 20 that defined the device 204 may be installed on a platform that may be manned or unmanned and may be moveable or fixed. Step 304 may include or may be accomplished in number of different ways, such as through wireless connections and communications. However, one exemplary embodiment exploits the advantages of fixed transmission lines to receive the 0 bit of the 1 bit generated by the electrical device 204. Step 306 may further include or be accomplished by an inverter in the controller 58 to generate the negative bias voltage. In one instance, the positive bias voltage may be fed through the switching device 42 prior to sending the positive bias voltage to the power amplifier 14.

Method 300 may further include generating the 1 bit or the 0 bit with a battery that is a single cell battery. Then, outputting, from the single cell battery, a voltage that is less than about 3.6 volts. Thereafter, transmitting the voltage through an input in the switching circuit.

As mentioned previously, in accordance with one aspect, the switch circuit has a deliberate sequence to switch the amplifier 14 between its on-state and its off-state, and vice versa. In one instance, method 300 accomplishes this by transmitting the negative bias voltage before transmitting the positive bias voltage to the power amplifier.

Method 300 may further include generating, with the enable circuit, a control bias voltage; and transmitting the control bias voltage to a pin or port in the controller 58 having the inverter. Method 300 also may provide transmitting, from a controller in the switching circuit, the positive bias voltage to a switching device in the switching circuit; and transmitting, the positive voltage bias from the switching device to the power amplifier.

Method 300 may further include creating, with a charge pump, a negative voltage bias at a regular frequency depending on an amount of current in the circuit.

Method 300 may further include generating the 1 bit or the 0 bit with a battery; receiving the 1 bit or the 0 bit in an enabling circuit; transmitting the 1 bit or the 0 bit through a trigger in the enabling circuit; and transmitting the 1 bit or the 0 bit through an exclusive OR gate logic in the enabling circuit. In addition to this exemplary embodiment, method 300 may further include generating, with the enabling circuitry, a shutdown signal based on the 1 bit or the 0 bit; and receiving, at a pin in a controller having an inverter, the shutdown signal along transmission line from the enabling circuit.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof for assembly 200. When portions of assembly 200 are implemented in or with software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code to control assembly 200 or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones to control the assembly 200 may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms or the assembly 200. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

The broadly used term "transmission line" is only a transmission line in the sense it allows for transmission of the DC signal. It is not a controlled impedance line.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral" and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present disclosure.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

What is claimed is:

1. A method comprising:
   receiving, in an enabling circuit coupled to a switching circuit powered by a battery, a 1 bit or the 0 bit;
   generating, in the switching circuit, a negative bias voltage and a positive bias voltage in response to the enabling circuit receiving the 1 bit or the 0 bit;
   transmitting the negative bias voltage and the positive bias voltage to a power amplifier;
   turning the power amplifier from an off-state to an on-state in response to receiving the negative bias voltage; and
   amplifying, with the power amplifier, a power signal moving through the power amplifier when the power amplifier is in the on-state.

2. The method of claim 1, further comprising:
   wherein the battery that is a single cell battery;
   outputting, from the single cell battery, a voltage that is less than about 3.6 volts; and
   transmitting the voltage through an input in the switching circuit.

3. The method of claim 1, further comprising:
   transmitting the negative bias voltage to the power amplifier before transmitting the positive bias voltage to the power amplifier.

4. The method of claim 1, further comprising:
   generating, with the enable circuit, a control bias voltage; and
   transmitting the control bias voltage to a pin or port in a controller having an inverter.

5. The method of claim 1, further comprising:
   transmitting, from a controller in the switching circuit, the positive bias voltage to a switching device in the switching circuit; and
   transmitting, the positive voltage bias from the switching device to the power amplifier subsequent to the negative voltage bias is sent to the power amplifier.

6. The method of claim 1, further comprising:
   creating, with a charge pump, a negative voltage bias at a regular frequency depending on an amount of current in the circuit.

7. The method of claim 1, further comprising:
   receiving the 1 bit or the 0 bit in the enabling circuit;
   transmitting the 1 bit or the 0 bit through a trigger in the enabling circuit; and
   transmitting the 1 bit or the 0 bit through an exclusive OR gate logic in the enabling circuit.

8. The method of claim 7, further comprising:
   generating, with the enabling circuit, a shutdown signal based on the 1 bit or the 0 bit; and
   receiving, at a pin in a controller having an inverter, the shutdown signal along transmission line from the enabling circuit.

9. The method of claim 1, further comprising:
   applying a voltage from the battery at a first node of an inverter in a controller in the switching circuit;
   applying a control voltage from the enabling circuit to another node of the inverter; and
   shutting down the power amplifier in response to the controller receiving the voltage and the control voltage.

10. The method of claim 1, further comprising:
    receiving the power signal in the power amplifier from the electrical device, wherein the electrical device is a radio frequency (RF) device and the power signal is an RF power signal.

11. An assembly comprising:
    a battery powering an electrical device;
    a bias sequencing and switching circuit coupled with the battery that generates bias voltages;
    a power amplifier connected to the bias sequencing and switching circuit that is switched between an on-state and an off-state in response to the bias voltages;
    an enabling circuit in the bias sequencing and switching circuit that receives a 1 bit or a 0 bit;
    a controller circuit in the bias sequencing and switching circuit, and the controller circuit having an inverter; and
    a port or pin on the controller circuit coupled to a portion of the enable circuit.

12. The assembly of claim 11, further comprising:
    a switching device in the bias sequencing and switching circuit coupled to a different port or pin on the controller circuit and coupled with the power amplifier; and
    wherein the enable circuit is operative to transmit an enabling signal to be sent to the inverter that is timed to produce a negative bias voltage as the first output of the controller.

13. The assembly of claim 11, further comprising:
    a positive bias generated by the bias sequencing and switching circuit; and
    a negative bias generated by the bias sequencing and switching circuit;
    wherein an initiation sequence of the bias sequencing and switching circuit is operative to send the negative bias from the bias sequencing and switching circuit to the power amplifier and subsequently send the positive bias from the bias sequencing and switching circuit to the power amplifier.

14. The assembly of claim 13, further comprising:

at least two parallel resistors along a transmission line carrying the positive bias from the bias sequencing and switching circuit to the RF power amplifier; and at least one resistor along a transmission line carrying the negative bias from the bias sequencing and switching circuit to the RF power amplifier.

15. The assembly of claim 11, further comprising:

a single cell in the battery that produces a voltage of about 3.6 volts or less.

16. A switching circuit comprising:

a controller including an inverter and a plurality of nodes;

a switching device connected to the controller via a transmission line extending from the node on the switching device to a node on the controller, and the switching device is operative to generate a positive bias voltage and the controller is operative to generate a negative bias voltage;

an enabling circuit coupled to the controller and the switching device, and the enabling circuit includes a first input operative to receive a 0-bit or a 1-bit and a second input operative to receive the other of a 0-bit or a 1-bit;

a transmission line connected to an output node of the switching device that is operative to transmit the positive bias voltage to a power amplifier;

a transmission line connected to an output node of controller that is operative to transmit the negative bias voltage to the power amplifier; and a voltage input coupled with a transmission line connected to the controller.

17. The switching circuit of claim 16, further comprising:

a bank of capacitors connected between the voltage input and the switch device adapted to condition power flowing through the voltage input as a filter.

* * * * *